(12) United States Patent
Chen et al.

(10) Patent No.: US 6,297,528 B1
(45) Date of Patent: Oct. 2, 2001

(54) DUAL LAYER POLY DEPOSITION TO PREVENT AUTO-DOPING IN MIXED-MODE PRODUCT FABRICATION

(76) Inventors: Chien-Feng Chen; Shyh-Perng Chiou, both of No. 121, Park Ave. III, Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 09/519,613

(22) Filed: Mar. 6, 2000

Related U.S. Application Data

(62) Division of application No. 09/058,127, filed on Apr. 10, 1998, now Pat. No. 6,033,950.

(51) Int. Cl.[7] .................. H01L 27/108; H01L 29/76; H01L 29/94; H01L 31/119; H01L 21/8242
(52) U.S. Cl. .................. 257/311; 257/296; 438/239; 438/395; 438/592; 438/657; 438/652
(58) Field of Search .................. 257/311, 296; 438/239, 250, 252, 395, 592, 657, 652

(56) References Cited

U.S. PATENT DOCUMENTS

| | | | |
|---|---|---|---|
| 4,894,349 | * 1/1990 | Saito et al. | 437/95 |
| 4,925,809 | 5/1990 | Yoshiharu et al. | 437/95 |
| 4,997,775 | * 3/1991 | Cook et al. | 437/31 |
| 5,070,382 | 12/1991 | Cambou | 357/48 |
| 5,461,002 | 10/1995 | Safir | 437/160 |
| 5,492,868 | 2/1996 | Lin et al. | 437/228 |
| 5,646,061 | * 7/1997 | Wang et al. | 437/52 |
| 5,837,582 | * 11/1998 | Su | 438/255 |
| 5,872,045 | * 2/1999 | Lou et al. | 438/432 |
| 5,913,119 | * 6/1999 | Lin et al. | 438/255 |

\* cited by examiner

*Primary Examiner*—Wael Fahmy
*Assistant Examiner*—Neal Berezny

(57) ABSTRACT

A new method of fabricating a capacitor and PMOS devices in a mixed-mode product production in which a composite polysilicon top plate electrode is provided which prevents out-diffusion of dopant from the capacitor plate so that there is no auto-doping of the PMOS channel region is described. A layer of gate silicon oxide is provided over the surface of a semiconductor substrate. A first polysilicon layer is deposited overlying the gate silicon oxide layer. The first polysilicon layer and gate oxide layer are etched away where they are not covered by a mask to provide a PMOS gate electrode in a first region of the wafer and a bottom plate electrode for the capacitor in a second region of the wafer. A capacitor dielectric layer is deposited over the surface of the wafer. A composite polysilicon layer is deposited overlying the capacitor dielectric layer wherein the composite polysilcon layer comprises a lower doped polysilcon layer and an upper undoped polysilicon layer. The composite polysilicon layer and capacitor dielectric layer are etched away where they are not covered by a mask to leave the capacitor dielectric layer and the composite polysilicon layer overlying the bottom plate electrode wherein the composite polysilicon layer forms the top plate electrode of the capacitor. The upper undoped polysilicon layer prevents out-diffusion from the lower doped polysilicon layer during thermal cycles thus preventing auto-doping.

9 Claims, 3 Drawing Sheets

DUAL LAYER POLY DEPOSITION TO PREVENT AUTO-DOPING IN MIXED-MODE PRODUCT FABRICATION

This is a division of patent application Ser. No. 09/058,127, filing date Apr. 10, 1998, Now U.S. Pat. No. 6,033,950 A Dual Layer Poly Deposition To Prevent Auto-Doping In Mixed-Mode Product Fabrication, assigned to the same assignee as the present invention.

BACKGROUND OF THE INVENTION (1) Field of the Invention

The invention relates to the fabrication of integrated circuit devices, and more particularly, to a method of preventing auto-doping from the top polysilicon layer of a capacitor in the manufacture of integrated circuits.

(2) Description of the Prior Art

In the manufacture of integrated circuit devices, a so-called mixed-mode product fabrication is one in which MOSFET device structures and capacitor structures are formed on the same wafer. A capacitor is formed by using two polysilicon layers as the top and bottom plates of the capacitor with a dielectric layer therebetween. The polysilicon layers are formed either by in-situ polysilicon deposition or POCl-doped polysilicon. In either case, the dopant; that is, phosphorus; is spread throughout the polysilicon layer and tends to diffuse out of the polysilicon in post-poly etch thermal cycles. The out-diffused dopants will reach the silicon surface if the oxide on the surface is not thick enough to prevent further diffusion into the substrate in subsequent thermal processes. In a PMOS device on the same wafer, the out-diffused phosphorus will laterally and vertically increase the n-type dopant concentration near or under the edge of the channel region after thermal cycles. This is called auto-doping.

FIG. 1 illustrates this auto-doping phenomenon. A capacitor 50 has been fabricated overlying a field oxide region 12 on a semiconductor substrate 10. The capacitor comprises a polysilicon bottom electrode 41, dielectric layer 43, and top polysilicon electrode 45. Elsewhere on the wafer, a PMOS gate electrode device 52 has been formed. During thermal cycles, dopant 55 from the top capacitor electrode 45 out-diffuses into the atmosphere and into the substrate at the edge of the PMOS channel region 57. Because of the n-type dopant near the channel region, higher gate voltage will have to be applied to invert the channel region in order to form a conducting channel from source to drain. This results in a threshold voltage ($V_t$) shift. In auto-doping, the n-type dopants come from the same wafer on which the PMOS devices are fabricated, as illustrated in FIG. 1, or dopants may come from the wafers positioned either before or after the wafer on which the PMOS devices are fabricated.

It is desired to prevent auto-doping. Two approaches to preventing auto-doping can be adopted. In one approach, the thickness of the oxide on the surface of the substrate can be increased so that it can retard the penetration of dopants. This approach is taught in the prior art of U.S. Pat. No. 5,461,002 to Safir and in U.S. Pat. Nos. 5,492,868 to Lin et al and 4,925,809 to Yoshiharu et al.

A second approach to preventing auto-doping is to prevent the out-diffusion of dopants from the n-type capacitor plate. This approach is taught in U.S. Pat. Nos. 5,070,382 to Cambou and 4,894,349 to Saito et al.

A third approach does not prevent auto-doping, but etches away those areas that have been auto-doped. This approach is taught in U.S. Pat. No. 5,461,002 to Safir.

The process of the present invention takes the second approach of preventing out-diffusion of dopants from the capacitor plate.

SUMMARY OF THE INVENTION

A principal object of the present invention is to provide an effective and very manufacturable method of fabricating a capacitor and PMOS devices in a mixed-mode product production.

Another object of the invention is to provide a method of fabricating a capacitor in which out-diffusion of dopant from the top capacitor plate is prevented.

Another object is to provide a method of fabricating a capacitor and PMOS devices in a mixed-mode product production in which there is no auto-doping of the PMOS channel region.

A further object of the present invention is to provide a composite polysilicon top plate electrode in the fabrication of a capacitor which prevents out-diffusion of dopant from the capacitor plate.

A still further object is to provide a method of fabricating a capacitor and PMOS devices in a mixed-mode product production in which a composite polysilicon top plate electrode is provided which prevents out-diffusion of dopant from the capacitor plate so that there is no auto-doping of the PMOS channel region.

In accordance with the objects of this invention a new method of fabricating a capacitor and PMOS devices in a mixed-mode product production in which a composite polysilicon top plate electrode is provided which prevents out-diffusion of dopant from the capacitor plate so that there is no auto-doping of the PMOS channel region is achieved. A layer of gate silicon oxide is provided over the surface of a semiconductor substrate. A first polysilicon layer is deposited overlying the gate silicon oxide layer. The first polysilicon layer and gate oxide layer are etched away where they are not covered by a mask to provide a PMOS gate electrode in a first region of the wafer and a bottom plate electrode for the capacitor in a second region of the wafer. A capacitor dielectric layer is deposited over the surface of the wafer. A composite polysilicon layer is deposited overlying the capacitor dielectric layer wherein the composite polysilicon layer comprises a lower doped polysilicon layer and an upper undoped polysilicon layer. The composite polysilicon layer and capacitor dielectric layer are etched away where they are not covered by a mask to leave the capacitor dielectric layer and the composite polysilicon layer overlying the bottom plate electrode wherein the composite polysilicon layer forms the top plate electrode of the capacitor to complete the formation of an integrated circuit having a capacitor and PMOS devices fabricated on the same wafer. The upper undoped polysilicon layer prevents out-diffusion from the lower doped polysilicon layer during thermal cycles thus preventing auto-doping.

Also in accordance with the objects of this invention, a mixed-mode integrated circuit device having a composite polysilicon top plate capacitor electrode which prevents out-diffusion of dopant from the capacitor plate so that there is no auto-doping of the PMOS channel region is achieved. A PMOS gate electrode overlies a semiconductor substrate in a first region of the integrated circuit device. Source and drain regions lie within the semiconductor substrate adjacent to the PMOS gate electrode. A capacitor overlies the semiconductor substrate in a second region of the integrated circuit device. The capacitor comprises: a bottom plate electrode overlying the semiconductor substrate, a capacitor dielectric layer overlying the bottom plate electrode, and a top plate electrode comprising a composite polysilicon layer overlying the capacitor dielectric layer. The composite polysilicon layer comprises a lower doped polysilicon layer and an upper undoped polysilicon layer. The upper undoped polysilicon layer prevents out-diffusion from the lower doped polysilicon layer during thermal cycles thus preventing auto-doping.

BRIEF DESCRIPTION OF THE DRAWINGS

In the accompanying drawings forming a material part of this description, there is shown.

DESCRIPTION OF THE PREFERRED EMBODIMENTS

Figure 1:
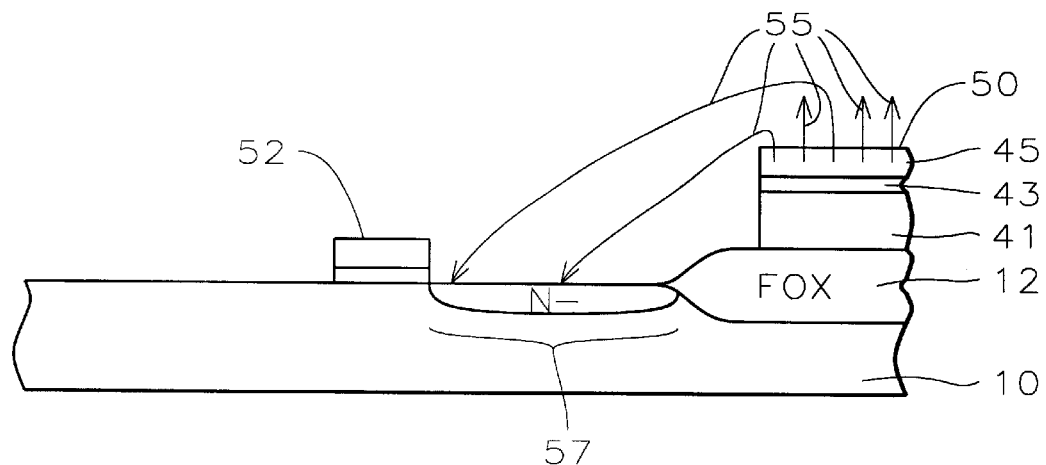
FIG. 1 schematically illustrates in cross-sectional representation the auto-doping problem of the prior art.
Figure 2:
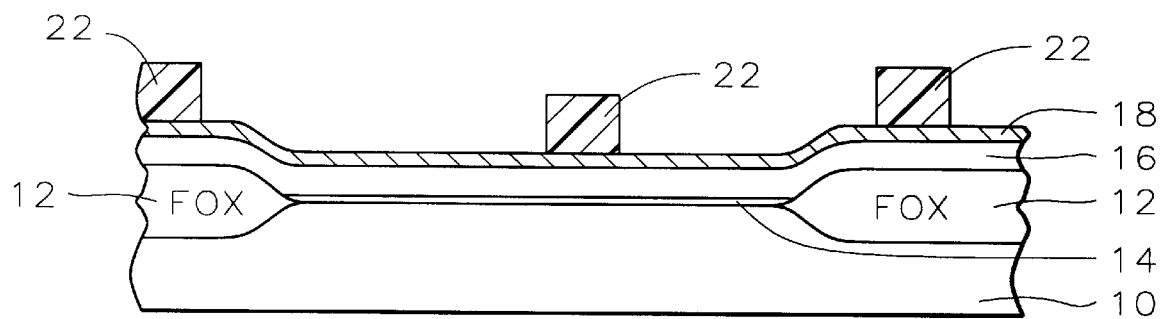
FIGS. 2 through 7 schematically illustrate in cross-sectional representation a preferred embodiment of the present invention.

Referring now more particularly to FIG. 2, there is shown an illustration of a portion of a partially completed integrated circuit. The first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, Field OXide regions 12 are formed in and on the semiconductor substrate as is conventional in the art.

The surface of the silicon substrate 10 is thermally oxidized to form the desired gate oxide 14 thickness which is between about 100 to 250 Angstroms. Alternatively, the oxide layer 14 may be deposited over the surface of the substrate. The polysilicon layer 16 is blanket deposited, for example, by low pressure chemical vapor deposition (LPCVD) to a thickness of between about 1400 to 1600 Angstroms. A silicide layer 18, such as tungsten silicide is deposited over the polysilicon layer 16 to a typical thickness of between about 1190 and 1310 Angstroms.

Figure 3:
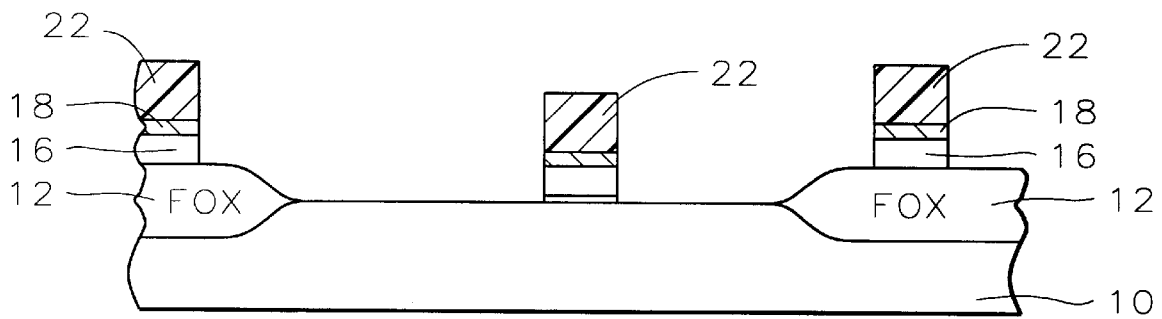

A photoresist mask 22 is formed over the surface of the substrate. The layers 18, 16, and 14 are patterned using conventional lithography and etching techniques to provide a desired pattern of gate electrodes and interconnection runners on the FOX 12 surfaces and elsewhere as seen in FIG. 3.

Figure 4:
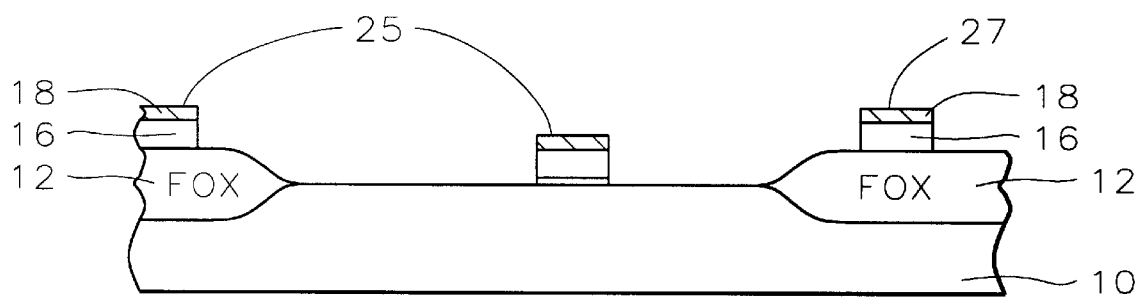

The photoresist mask is removed. FIG. 4 illustrates the completed PMOS polycide gate electrodes 25 and the polycide line 27 that will form the bottom plate of the capacitor.

Figure 5:
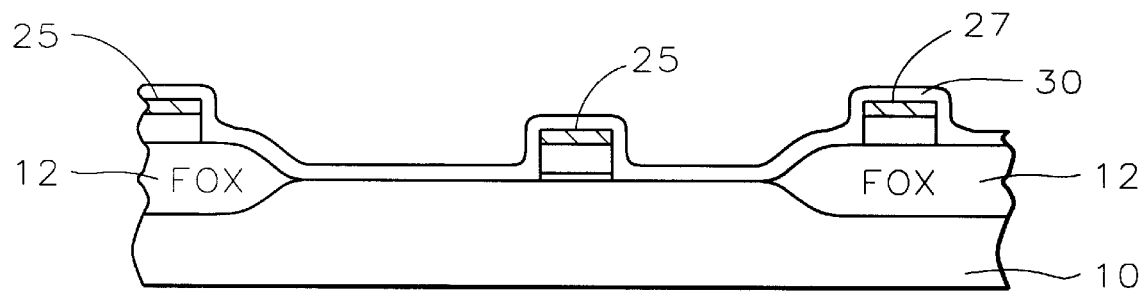

Referring now to FIG. 5, a capacitor dielectric layer 30 is formed consisting of silicon oxide-silicon nitride-silicon oxide (ONO), silicon nitride-silicon oxide (NO) or other suitable known dielectric having a typical thickness of between about 360 and 380 Angstroms.

The novel composite polysilicon top plate electrode of the present invention will now be described. The composite polysilicon layer is composed of a lower doped layer and an upper undoped layer. The thickness of the upper layer is chosen to be thick enough such that dopants in the lower layer will not out-diffuse in subsequent thermal cycles. The thickness of the undoped upper layer is theoretically calculated to be about 199 Angstroms. However, it was determined by experimentation that a thickness of 600 Angstroms is required to accommodate the diffusion distance in subsequent thermal cycles. The preferred polysilicon thickness is 2430 to 2970 Angstroms in which the lower doped polysilicon layer has a thickness of 1900 to 2300 Angstroms and the upper undoped polysilicon layer has a thickness of 540 to 660 Angstroms. The thickness composition may vary depending upon post-polysilicon etch thermal cycles in different products. Higher thermal cycles require a thicker undoped polysilicon layer. The thickness required is determined experimentally by measuring the PMOS threshold voltages ($V_{TP}$) of several wafer splits with different upper undoped thicknesses. The thickness which results in almost the same $V_{TP}$ as the standard case with no auto-doping, typically −0.90 volt, would be the optimal thickness. Thicknesses other than this would either be too thin to prevent outdiffusion or too thick for other purposes.

For the PMOS transistor 25, the $V_{TP}$ will drift if the opposite type dopant, such as phosphorus, diffuses into the p+ source region. This is the auto-doping phenomenon. This would result in the reduction of the effective hole type carrier in the near channel to conduct between the source and drain. In the normal case without auto-doping effects, $V_{TP}$ ranges from −0.88 to −0.92 volt. In the auto-doping case, the $V_{TP}$ would increase in magnitude to −0.95 or −1.01 or even higher. This is because the phosphorus diffused into the p+ source region counterbalances the boron concentration in the source region. In order to form a channel between the source and the drain, the $V_{TP}$ must increase.

Therefore, the composite polysilicon upper electrode of the present invention is fabricated so as to prevent the outdiffusion of phosphorus from the electrode into the p+ source region.

The thickness of the upper undoped layer depends on the lower layer dopant concentration and the post poly etch thermal cycles, as explained above. The dopant concentration gradient and the post poly etch thermal cycles determine how far the dopant in the lower layer will migrate into the upper undoped layer. The upper layer thickness should be at least larger than the distance travelled by the dopants to prevent auto-doping.

Figure 6:
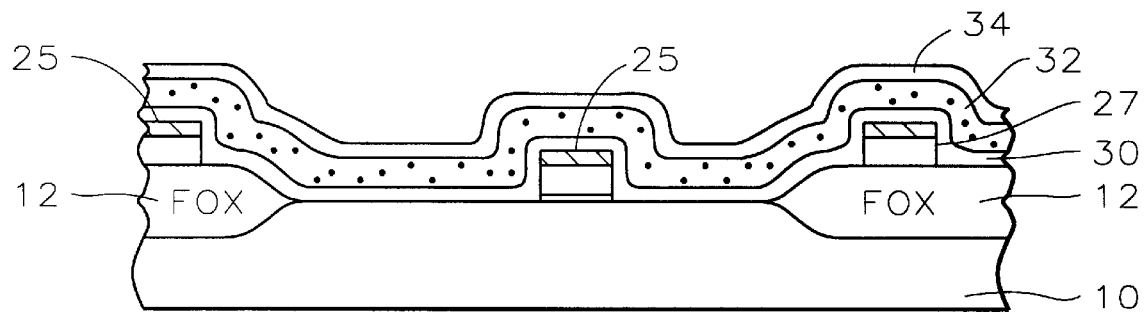

Referring now to FIG. 6, the composite polysilicon layer is deposited over the capacitor dielectric layer 30. Lower polysilicon layer 32 is deposited by LPCVD to a thickness of between about 1900 and 2300 Angstroms. The lower polysilicon layer 32 is in-situ doped to a dopant concentration of between about 2E19 and 1E20 atoms/cm$^3$. Next, the upper undoped polysilicon layer 34 is deposited over the doped polysilicon layer 32. The undoped polysilicon layer 34 is deposited by LPCVD to a thickness, determined as described above, of between about 540 and 600 Angstroms.

Figure 7:
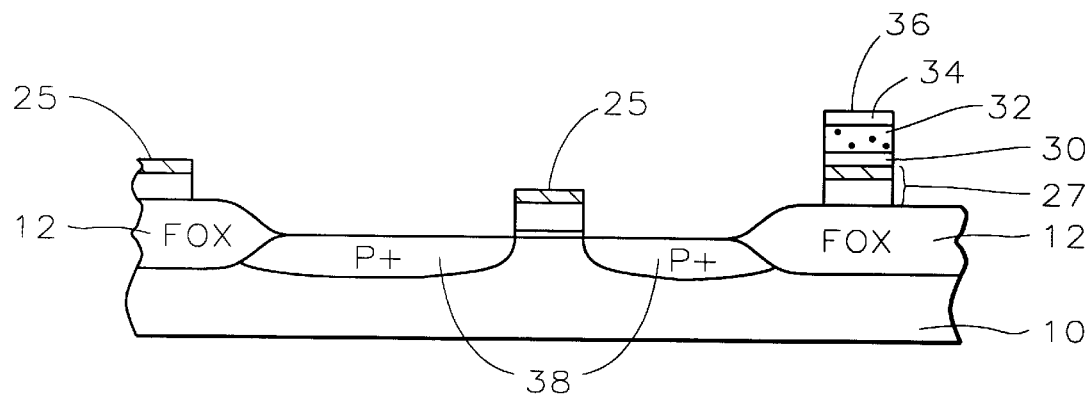

The layers 34, 32, and 30 are now etched away where they are not covered by a mask (not shown) to form the capacitor 36 illustrated in FIG. 7.

The source/drain structure of the PMOS FET may now be formed. Ions are implanted into the semiconductor substrate to form P+ source and drain regions 38. The undoped polysilicon layer 34 will prevent auto-doping of the substrate in the area of the source and drain regions. Out-diffusion of dopant from the polysilicon layer 32 during subsequent thermal cycles is prevented by the presence of the undoped polysilicon layer 34. The undoped layer 34 will absorb all of the dopant that out-diffuses from the layer 32. None of the dopant will be released into the atmosphere.

Figure 8:
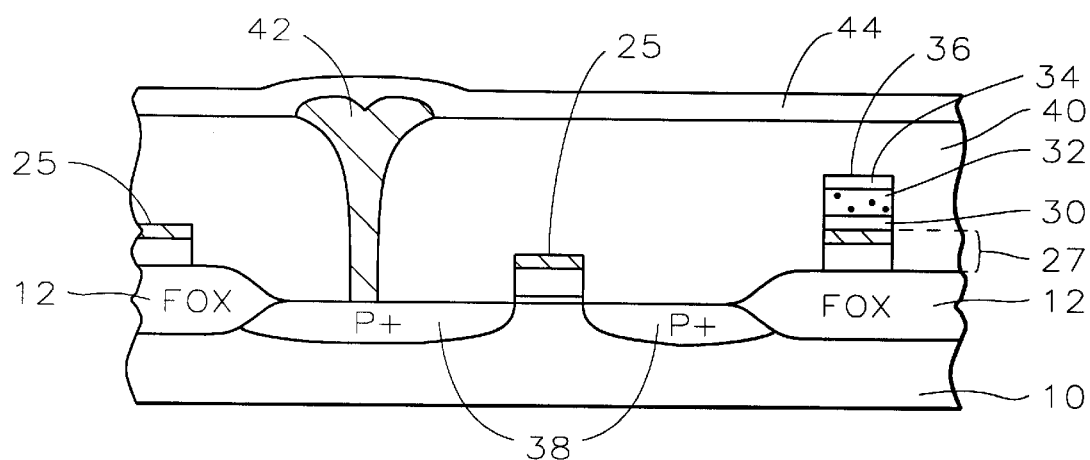
FIG. 8 schematically illustrates in cross-sectional representation a completed mixed-mode integrated circuit device fabricated by the process of the present invention.

Processing continues as is conventional in the art to complete the integrated circuit device. For example, as illustrated in FIG. 8, a thick insulating layer 40, composed of borophosphosilicate glass (BPSG), phosphosilicate glass (PSG), silicon dioxide, or the like, is blanket deposited over the capacitor and PMOS structures 27 and 25, respectively. A contact opening is etched through the thick insulating layer and a metal line 42 is formed to complete the contact to the source/drain region 38 or elsewhere as required to complete electrical connections. Passivation layer 44 completes the integrated circuit device.

The process of the present invention provides an effective method of eliminating auto-doping of the PMOS portion of a mixed-mode product by preventing out-diffusion of dopant from the top electrode plate of a capacitor. The composite polysilicon top electrode plate of the invention having a lower doped layer and an upper undoped layer prevents out-diffusion of dopant. The thickness of the upper undoped layer can be varied depending upon the thermal cycles of different products.

According to another aspect of the present invention, a mixed-mode integrated circuit device having a capacitor and PMOS devices formed on the same wafer is described with reference to FIG. 8. PMOS device structures including gate electrode and interconnection lines 25 are formed on the surface of a semiconductor substrate 10. P+ source and drain regions 38 lie within the semiconductor substrate adjacent to gate electrode 25. A capacitor 36 is formed on the same wafer as the PMOS device structures. The capacitor comprises bottom plate electrode 27, capacitor dielectric 30, and composite top plate electrode 32/34.

The bottom plate electrode 27 comprises a first doped polysilicon layer underlying a silicide layer, such as tungsten silicide. The capacitor dielectric layer 30 comprises silicon oxide-silicon nitride-silicon oxide (ONO), silicon nitride-silicon oxide (NO) or other suitable known dielectric.

The composite polysilicon layer is composed of a lower doped layer and an upper undoped layer. The thickness of the upper layer is chosen to be thick enough such that dopants in the lower layer will not out-diffuse during thermal cycles subsequent to fabricating the capacitor. The thickness composition may vary depending upon post-polysilicon etch thermal cycles in different products. Higher thermal cycles require a thicker undoped polysilicon layer. The thickness required is determined by measuring the PMOS threshold voltage. The operational range for the lower doped polysilicon layer 32 thickness is between about 1900 and 2300 Angstroms. The operational range for the upper undoped polysilicon layer 34 thickness is between about 540 and 600 Angstroms. Metal contacts such as 42 extend through the insulating layer 40 to source/drain region 38, or the like.

The device of the present invention requires a gate voltage in the desired range. Threshold voltage shift has been eliminated because auto-doping of the edge of the channel region has been prevented by the composite top plate electrode of the capacitor.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
    a PMOS gate electrode overlying a semiconductor substrate in a first region of said integrated circuit device;
    source and drain regions within said semiconductor substrate adjacent to said PMOS gate electrode; and
    a capacitor overlying said semiconductor substrate in a second region of said integrated circuit device, said capacitor comprising:
        a bottom plate electrode overlying said semiconductor substrate;
        a capacitor dielectric layer overlying said bottom plate electrode; and
        a top plate electrode comprising a composite polysilicon layer overlying said capacitor dielectric layer wherein said composite polysilicon layer comprises a lower doped polysilicon layer and an upper undoped polysilicon layer.

2. A device according to claim 1 wherein said PMOS gate electrode comprises a first polysilicon layer underlying a silicide layer.

3. A device according to claim 1 wherein said bottom plate electrode comprises a first polysilicon layer underlying a silicide layer.

4. A device according to claim 1 wherein said capacitor dielectric comprises a first layer of silicon oxide underlying a second layer of silicon nitride underlying a third layer of silicon oxide.

5. A device according to claim 1 wherein said capacitor dielectric comprises a first layer of silicon nitride underlying a second layer of silicon oxide.

6. A device according to claim 1 wherein said composite polysilicon layer has a thickness of between about 2500 and 2900 Angstroms.

7. A device according to claim 1 wherein said lower doped polysilicon layer has a thickness of between about 1900 and 2300 Angstroms.

8. A device according to claim 1 wherein said lower doped polysilicon layer is in-situ doped to a concentration of between about 2E19 and 1E20 atoms/cm$^3$.

9. A device according to claim 1 wherein said upper undoped polysilicon layer has a thickness of between about 540 and 660 Angstroms.

* * * * *

UNITED STATES PATENT AND TRADEMARK OFFICE
CERTIFICATE OF CORRECTION

PATENT NO. : 6,297,528 B1 Page 1 of 1
DATED : October 2, 2001
INVENTOR(S) : Chien-Feng Chen and Shyh-Perng Chiou It is certified that error appears in the above-identified patent and that said Letters Patent is hereby corrected as shown below:

<u>Title page,</u>
Item [76], Inventors, correct to read:

-- Chien-Feng Chen, Taichung (TW); Shyh-Perng Chiou, Miaoli (TW) --.

Add Item -- [74] *Attorney, Agent or Firm* - George O. Saile; Stephen B. Ackerman; Rosemary L. S. Pike --.

Add Item -- [73] Assignee: Taiwan Semiconductor Manufacturing Company, Hsih-Chu, Taiwan --.

Signed and Sealed this

Twenty-seventh Day of May, 2003

JAMES E. ROGAN
*Director of the United States Patent and Trademark Office*